(12) United States Patent
Nishino et al.

(10) Patent No.: US 9,632,117 B2
(45) Date of Patent: Apr. 25, 2017

(54) ELECTRON BEAM DETECTING DEVICE

(71) Applicant: Shibuya Kogyo Co., Ltd., Ishikawa (JP)

(72) Inventors: Yukinobu Nishino, Ishikawa (JP); Yuichi Takenaka, Ishikawa (JP); Youhei Sakamoto, Ishikawa (JP); Ryo Abe, Ishikawa (JP)

(73) Assignee: SHIBUYA KOGYO CO., LTD., Ishikawa (JP)

( * ) Notice: Subject to any disclaimer, the term of this patent is extended or adjusted under 35 U.S.C. 154(b) by 210 days.

(21) Appl. No.: 14/424,263

(22) PCT Filed: Jul. 30, 2013

(86) PCT No.: PCT/JP2013/070563
§ 371 (c)(1),
(2) Date: Feb. 26, 2015

(87) PCT Pub. No.: WO2014/034353
PCT Pub. Date: Mar. 6, 2014

(65) Prior Publication Data
US 2015/0331018 A1 Nov. 19, 2015

(30) Foreign Application Priority Data
Aug. 31, 2012 (JP) .................. 2012-192068

(51) Int. Cl.
*H01J 33/04* (2006.01)
*G01R 19/165* (2006.01)
(Continued)

(52) U.S. Cl.
CPC ....... *G01R 19/165* (2013.01); *G01R 19/0092* (2013.01); *G21K 5/04* (2013.01); *H01J 33/04* (2013.01)

(58) Field of Classification Search
CPC .... G21K 5/04; G01R 19/0092; G01R 19/165; H01J 33/04
(Continued)

(56) References Cited

U.S. PATENT DOCUMENTS 5,254,911 A 10/1993 Avnery et al.
7,592,613 B2 9/2009 Kristiansson et al.
(Continued)

FOREIGN PATENT DOCUMENTS

EP 0 549 113 6/1993
EP 1 104 002 5/2001
(Continued)

OTHER PUBLICATIONS

International Search Report, mailed Sep. 3, 2013, for International Application No. PCT/JP2013/070563.
(Continued)

*Primary Examiner* — David Porta
*Assistant Examiner* — Gisselle Gutierrez
(74) *Attorney, Agent, or Firm* — Greenblum & Bernstein, P.L.C.

(57) ABSTRACT

An electron beam detecting device detects a state of an electron beam radiated by an electron beam radiation device. A plurality of wire electrodes, which are conductors, are disposed corresponding to a plurality of filaments, the wire electrodes being electrically insulated from each other, in the area in which the electron beams are radiated. The electrical current flowing through each of the wire electrodes is measured by an electric current measuring instrument (measuring unit). A CPU (determining unit) determines the radiation level of the electron beams by receiving a signal output by the electric current measuring instrument. The CPU judges that when the measuring instrument measures a decrease of the current value, an abnormal condition exists (Continued)

in the filament corresponding to the conductor with the lower current value.

4 Claims, 3 Drawing Sheets

(51) Int. Cl.
    *G01R 19/00*     (2006.01)
    *G21K 5/04*     (2006.01)

(58) Field of Classification Search
    USPC .......................................................... 250/394
    See application file for complete search history.

(56) References Cited

U.S. PATENT DOCUMENTS

| | | |
|---|---|---|
| 2001/0015412 A1 | 8/2001 | Komori et al. |
| 2007/0114433 A1 | 5/2007 | Kristiansson et al. |
| 2007/0290148 A1 | 12/2007 | Kristiansson et al. |
| 2011/0062351 A1 | 3/2011 | Hikosaka et al. |

FOREIGN PATENT DOCUMENTS

| | | |
|---|---|---|
| JP | H04-105451 | 9/1992 |
| JP | H05-182620 | 7/1993 |
| JP | H08-106874 | 4/1996 |
| JP | H09-005498 | 1/1997 |
| JP | 11-084099 | 3/1999 |
| JP | 11-109098 | 4/1999 |
| JP | 2001-221898 | 8/2001 |
| JP | 2003-043197 | 2/2003 |
| JP | 2006-349357 | 12/2006 |
| JP | 4745399 | 5/2011 |
| WO | 2007/145560 | 12/2007 |
| WO | 2009/139399 | 11/2009 |

OTHER PUBLICATIONS

Extended European Search Report, mailed Mar. 16, 2016, from the European Patent Office (E.P.O.) in the corresponding European Patent Application No. 13832072.6.

Japanese Office Action, mailed Feb. 2, 2016, from the Japanese Patent Office in the corresponding Japanese Patent Application No. 2012-192068.

23 radiation window
25 filament
46 wire electric pole (conductor)
48 electric current measuring instrument (mesuring unit)
49 CPU (determining unit)

ELECTRON BEAM DETECTING DEVICE

TECHNICAL FIELD

The present invention relates to an electron beam detecting device using electron beams to sterilize caps fitted on a synthetic resin-made bottle, and more specifically, relates to a device for detecting whether filaments, which are an emission source of thermal electrons, are normal.

BACKGROUND ART

If the filaments are broken because of any reason while irradiating electron beams onto objects being conveyed at a high speed while being sterilized, the predetermined dose of electron beams cannot be obtained and the sterilizing process becomes insufficient. Therefore, the objects, which are not subjected to a sufficient amount of sterilization during the conveyance, should be ejected from the path. As a device for detecting broken filaments, various kinds of devices have been conventionally proposed. In the electron beam radiation device disclosed in Patent Document 1, the breaks are determined by measuring the electric current flowing through a plurality of filaments to check for changes in the whole electric current. In the electron beam radiation device disclosed in Patent Document 2, the total dose of electric beams is detected.
PATENT DOCUMENT 1: Japanese Unexamined Patent Publication No. (HEI) 11-109098
PATENT DOCUMENT 2: Japanese Patent No. 4745399

SUMMARY OF THE INVENTION

Problems to be Solved by the Invention

There is a problem with the electron beam radiation device of Patent Document 1, in which, although a break can be detected based on a change in the electric current value when the break occurs during the operation of the device, a break cannot be detected when the break occurs during maintenance, since the electric current value would not change. In the electron beam radiation devices of Patent Documents 1 and 2, the total electric current flowing through the filaments or the total dose of electric beams is measured, and thus, they cannot detect which filaments are broken.

An object of the present invention is to provide an electron beam detecting device in which even when a filament is broken other than during the operation of the electron beam detecting device, the break can be detected, and further, the broken filament can be specified.

Means for Solving the Problems

An electron beam detecting device according to the present invention comprises a plurality of conductors disposed corresponding to a plurality of filaments that are provided in the electron beam radiation device to radiate thermal electrons, the conductors being electrically insulated from each other, in the area in which the electron beams are radiated; a measuring unit measuring the current value flowing through each of the conductors; and a determining unit determining the radiation level of the electron beams by receiving a signal output by the measuring unit, wherein the determining unit judges that when the measuring unit measures a decrease in the current value, an abnormal condition exists in the filament corresponding to the conductor in which the lower current value is detected.

It is preferable that the plurality of conductors are disposed in parallel to the plurality of filaments, due to which the electron beam output from each of the conductors can be accurately detected.

The plurality of conductors may be attached to an outer surface of a radiation window for outputting the electron beams from the electron beam radiation device to the outside thereof. According to this structure, the electron beam, which was just radiated through the radiation window and has not diverged yet, can be detected. In this case, the plurality of conductors may be attached to an insulator, and the insulator may be fixed to the radiation window to enclose the radiation window.

Effects of the Invention

According to the present invention, even when a filament is broken other than during the operation of the electron beam detecting device, the break can be detected, and further, the broken filament can be specified.

EXPLANATION OF REFERENCES 23 radiation window
25 filament
46 wire electric pole (conductor)
48 electric current measuring instrument (measuring unit)
49 CPU (determining unit)

Embodiment of the Invention

Figure 1:
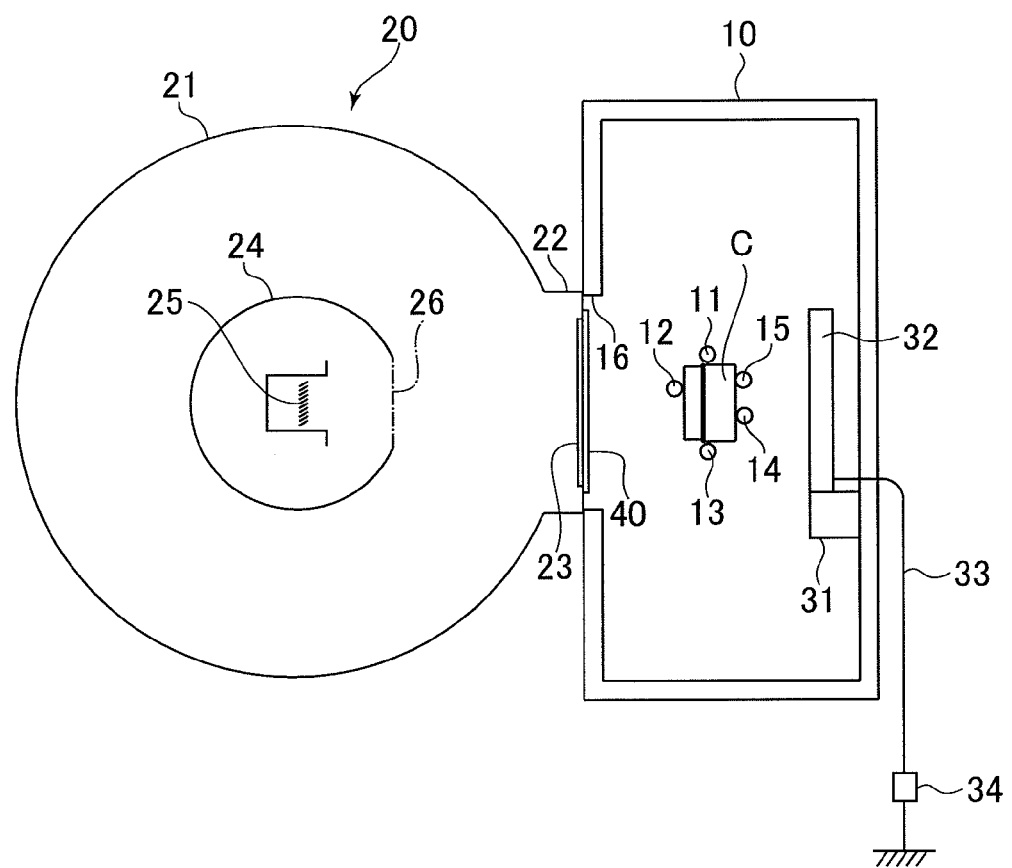
FIG. 1 A sectional view generally indicating a cap-sterilizing device comprising an electron beam detecting device, which is an embodiment of the present invention.

In the following, the present invention will be described with reference to an embodiment of the present invention. FIG. 1 generally indicates a construction of the cap-sterilizing device. Rod-shaped guides 11-15 are provided in parallel to each other in an aseptic chamber 10 of the cap-sterilizing device. These guides 11-15 extend in a direction perpendicular to the plane of the page in which FIG. 1 is indicated, to form a path through which a cap C passes, which is subjected to the sterilization. The cap C is fitted on a synthetic resin-made bottle, for example, and has a cylindrical shape with a closed bottom. The cap C is supplied from above the aseptic chamber 10, and is conveyed through a space enclosed by the guides 11-15 such that the opening of the cap faces the side (the left side in the drawing) of an electron beam radiation device 20 described later.

The electron beam radiation device 20 is fixed to a side surface of the aseptic chamber 10. A housing 21 of the electron beam radiation device 20 is formed with a frame portion 22, which is fixed to an opening 16 of the aseptic chamber 10. In the frame portion 22, a radiation window 23 is provided, which is made of a foil such as titanium, to output electron beams outside of the electron beam radiation device 20. The housing 21 is maintained in a vacuum state.

A terminal 24 is disposed in the center of the housing 21, and filaments 25, which are an emission source of thermal electrons, are housed in the terminal 24. A grid 26 is provided between the filaments 25 and the radiation window 23. On the other hand, in the aseptic chamber 10, a beam collector 32 is fixed to the opposite side of the opening 16, through an insulator 31. The beam collector 32 is grounded through a lead wire 33, on which an electric current measuring instrument 34 is provided.

Thermal electrons emitted from the filaments 25 are drawn to the grid 26, accelerated by a high voltage applied between the grid 26 and the radiation window 23, and radiated into the atmosphere in the aseptic chamber 10 through the radiation window 23. In the aseptic chamber 10, the electron beams reach the beam collector 32 with damping. In the beam collector 32, electric current occurs in accordance with the dose of electron beams, and the electric current value is measured by the electric current measuring instrument 34, so that it is determined whether the radiation levels of the electron beams radiated by the electron beam radiation device 20 are normal or not, i.e., the filaments 25 are normal or not. On the other hand, an electron beam detecting device 40 for detecting the radiation levels of the electron beams is provided on an outer surface of the radiation window 23, i.e., on a surface inside the aseptic chamber 10, as described below.

Figure 2:
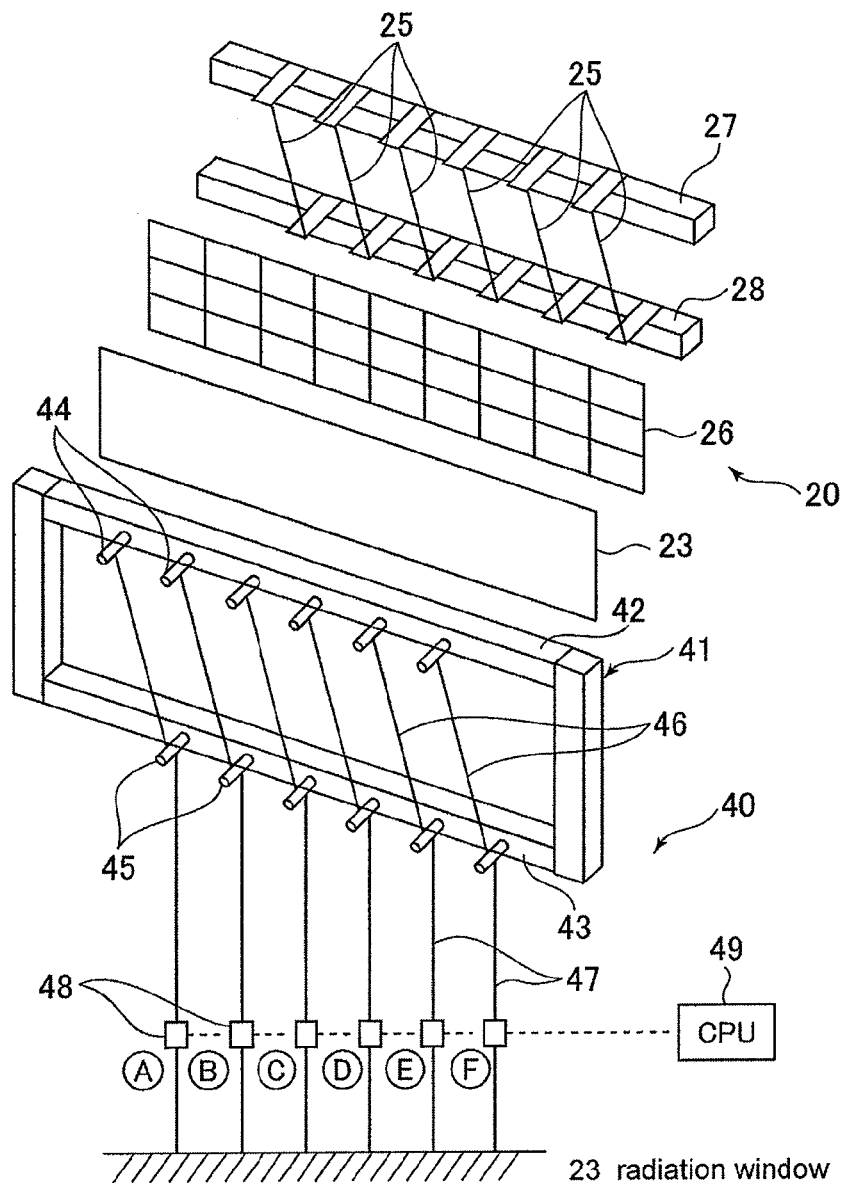
FIG. 2 A perspective view indicating a disposition relationship between an electron beam radiation device and the electron beam detecting device.

FIG. 2 shows a disposition relationship of the electron beam radiation device 20 and the electron beam detecting device 40. The filaments 25 are made of tungsten steel, for example, and in the illustrated example, six filaments are provided and positioned across a portion between a pair of support members 27 and 28, which are provided in parallel to each other. None of the filaments 25 are perpendicular to the support members 27 and 28, but each extends in a slightly slanted direction.

A frame member 41 of the electron beam detecting device 40 is an insulator, and has a pair of horizontal members 42 and 43, which are approximately the same length as the support members 27 and 28. The frame member 41 is positioned in the opening 16 of the aseptic chamber 10, and is fixed to the opening 16 to enclose the outer surface of the radiation window 23. Pins 44 are provided on the horizontal member 42 at regular intervals, and similarly, pins 45 are provided on the horizontal member 43 at regular intervals. Wire electrodes 46, which are conductors, are provided between the pins 44 and 45 in a tension state. The wire electrodes 46 are made of tungsten steel, for example, and their number is six, corresponding to the number of filaments 25. Namely, each of the wire electrodes 46 is disposed in parallel to the corresponding filament 25, extends in a slightly slanted direction relative to the horizontal members 42 and 43, and is electrically insulated from each other.

Electron beams are output from each of the filaments 25 toward the radiation window 23, and radiated into the aseptic chamber 10 through the radiation window 23. Electron beams radiated by a single filament 25 form a plane containing the filament 25 in the electron beam radiation device 20. The wire electrodes 46 are provided close to the radiation window 23, so that the electron beams passing through the radiation window 23 strike the wire electrodes 46. Namely, each of the wire electrodes 46 is arranged corresponding to each one of the plurality of filaments 25, on a line in the plane formed by the radiated electron beams.

Each of the wire electrodes 46 is grounded through a lead wire 47, on the midway of which an electric current measuring instrument 48 is provided. A beam current flows in the electrode 46 due to the collision of electron beams; the electric current value is measured by the measuring instrument (measuring unit) 48. Each of the measuring instruments 48 is electrically connected to a CPU (determining unit) 49. The measuring instruments 48 output detection signals corresponding to the electric current values, and the CPU 49 receives the detection signals to determine the radiation level of the electron beams. Specifically, when the measuring instruments 48 measure a lower current value compared to a predetermined value, it is judged that an abnormal condition exists in the filament 25 corresponding to the wire electrode 46 with the lower current value.

Figure 3:
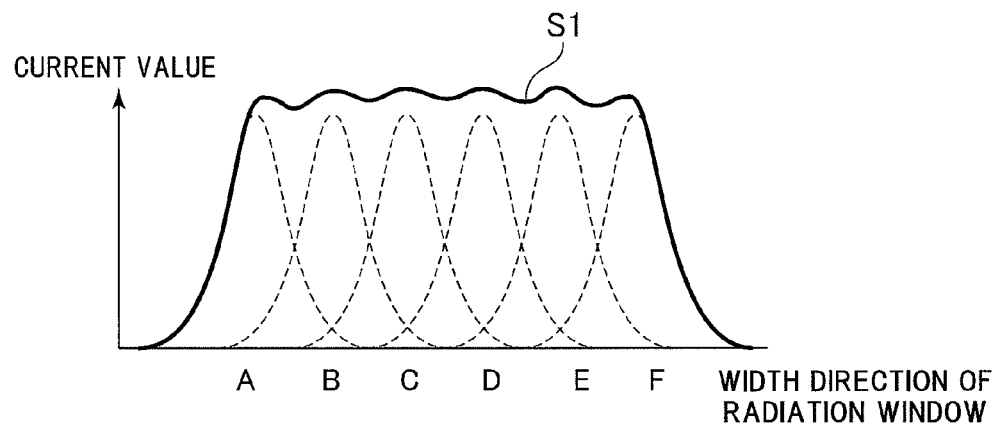
FIG. 3 A graph indicating a distribution of an electric current value when all the filaments are normal.
Figure 4:
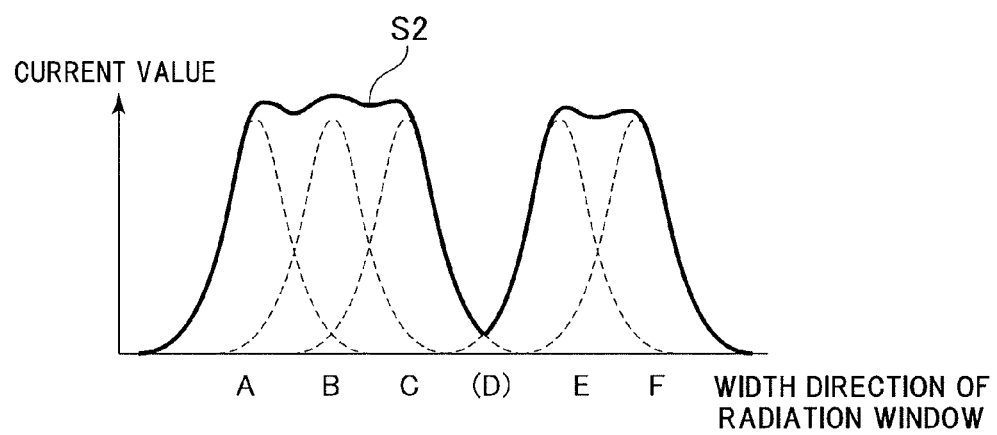
FIG. 4 A graph indicating a distribution of an electric current value when a part of the filaments is abnormal.

With reference to FIGS. 3 and 4, an operation of the embodiment will be described. Note that, in these drawings references A-F correspond to references A-F referred to on the wire electrodes 46 in FIG. 2.

When all of the filaments 25 are normal, as indicated in FIG. 3, the value of the electric current flowing through each of the wire electrodes 46 is the same as shown by the broken lines, and thus, the combined electric current shows an approximately constant value from reference A to reference F, as indicated by the solid line 51. Conversely, when the filament 25, corresponding to reference D, is broken, no electric current flows in the filament 25 as indicated in FIG. 4. Therefore, the combined electric current value is largely hollowed at a portion of reference D, as indicated by the solid line S2.

Thus, when a broken filament 25 exists, since electron beams do not strike the wire electrode 46 corresponding to the filament 25, a beam current does not occur. Therefore, the CPU 49 can specify the particular filament 25 that is broken, and can display it on a monitor, for example.

As described above, the embodiment is constructed in such a manner that a plurality of wire electrodes (conductors) 46 are disposed at positions corresponding to a plurality of filaments 25 to measure the electric currents flowing through each of the wire electrodes 46 and compare the values with each other. Accordingly, for example, if any filament is broken during maintenance of the electron beam radiation device 20, the break can be detected, and the broken filament can be specified.

Further, the wire electrodes 46 are attached to an outer surface of the radiation window 23 through the frame member 41 of an insulator, i.e., the outside of the electron beam radiation device 20. Therefore, during maintenance of the electron beam detecting device 40 it is not necessary to disassemble the electron beam radiation device 20; maintenance can be performed in a state in which the electron beam detecting device 40 is removed from the radiation window 23.

Note that, although the wire electrodes 46 are attached to the outer surface of the radiation window 23 in the embodiment, alternatively, the wire electrodes 46 may be provided inside of the radiation window 23, i.e., in the electron beam radiation device 20.

Further, in the embodiment, the wire electrodes 46 interfere with only a small part of the transmission area of the electron beams, and almost all of the electron beams are irradiated into the aseptic chamber 10. However, when it is acceptable that almost all of the electron beams encounter interference, a round rod-shaped or belt-shaped electrode can be used instead of the wire electrode 46.

Furthermore, instead of the construction in which the measuring instrument 48 is provided on each of the lead wires 47, another construction may be adapted in which a switch is provided to each of the lead wires 47, the switches are connected in series, and a single measuring instrument 48 is provided between the switches and the CPU 49. In this case, by successively operating the switches such that only one switch is turned ON, the value of electric current flowing through each of the wire electrodes 46 can be measured, so that a broken filament 25 can be specified.

The embodiment is an example in which the present invention is applied to a cap-sterilizing device, but the present invention can be applied to various kinds of devices using electron beams. For example, it can also be applied to technical fields, such as sterilization of sanitary containers, manufacture of certain types of film and sheets, and the fixing of ink and paint.

Since the wire electrodes 46 almost never interrupt electron beams, the electron beam radiation device 20 can be used not only for detecting the abnormal state of the filament 25, but also for monitoring a beam current occurring in accordance with the electron beams during radiation.

The invention claimed is:

1. An electron beam detecting device, by which a state of an electron beam radiated by an electron beam radiation device is detected, the electron beam detecting device comprising:
    a plurality of conductors disposed such that each one of the plurality of conductors is arranged corresponding to each one of a plurality of filaments, the plurality of filaments are provided in the electron beam radiation device to radiate thermal electrons, the conductors being electrically insulated from each other, in the area in which the electron beams are radiated;
    a plurality of measuring units, each measuring unit corresponding to one conductor, the plurality of measuring units measuring the current value flowing through each one of the conductors; and
    a determining unit determining the radiation level of the electron beams by receiving a signal output by each of the plurality of measuring units, the determining unit judging that when one of the measuring units measures a decrease in the electrical current value, an abnormal condition exists in the filament corresponding to the conductor in which the lower current value is detected.

2. The electron beam detecting device according to claim 1, wherein the plurality of conductors are disposed in parallel to the plurality of filaments.

3. The electron beam detecting device according to claim 1, wherein the plurality of conductors are attached to an outer surface of a radiation window for outputting the electron beams from the electron beam radiation device to the outside thereof.

4. The electron beam detecting device according to claim 3, wherein the plurality of conductors are attached to an insulator fixed to the radiation window to enclose the radiation window.

* * * * *